United States Patent [19]

Preissinger et al.

[11] 3,913,224

[45] Oct. 21, 1975

[54] PRODUCTION OF ELECTRICAL COMPONENTS, PARTICULARLY RC NETWORKS

[75] Inventors: Karl-Heinz Preissinger, Taufkirchen; Ulrich Wehnelt, Starnberg; Hermann Heywang; Manfred Kobale, both of Munich; Dietrich Ristow, Neubiberg, all of Germany

[73] Assignee: Siemens Aktiengesellschaft, Berlin & Munich, Germany

[22] Filed: Sept. 19, 1973

[21] Appl. No.: 398,863

[30] Foreign Application Priority Data

Sept. 27, 1972 Germany .......................... 2247279

[52] U.S. Cl. ...................... 29/625; 29/627; 29/628; 174/68.5; 317/101 B; 317/101 C

[51] Int. Cl.² .......................................... H05K 3/32

[58] Field of Search.. 29/625, 627, 203 B, 203 MW, 29/203 R, 628, 592, 619–621, 25.42; 174/68.5; 317/101 A, 101 B, 101 C, 101 CP, 101 CM, 101 CE, 101 D; 264/272; 219/56, 58

[56] References Cited

UNITED STATES PATENTS

| | | | |
|---|---|---|---|
| 2,958,120 | 11/1960 | Taylor | 29/625 |
| 3,079,672 | 3/1963 | Bain et al. | 29/625 |
| 3,102,213 | 8/1963 | Bedson et al. | 29/625 UX |
| 3,155,809 | 11/1964 | Griswold | 219/86 |
| 3,290,757 | 12/1966 | Tanck | 174/68.5 X |
| 3,353,263 | 11/1967 | Helms | 174/68.5 X |
| 3,371,249 | 2/1968 | Prohofsky | 174/68.5 X |
| 3,516,156 | 6/1970 | Steranko | 29/627 |
| 3,541,223 | 11/1970 | Helms | 174/68.5 |

*Primary Examiner*—Lowell A. Larson
*Assistant Examiner*—Joseph A. Walkowski
*Attorney, Agent, or Firm*—Hill, Gross, Simpson, Van Santen, Steadman, Chiara & Simpson

[57] ABSTRACT

Electrical components, particularly RC networks, are produced by a method in which a thermoplastic carrier foil supports one or more electrically conductive layers with insulating and/or dielectric layers between the conductive layers. In the method an electrically conductive layer or layers is or are applied to a carrier foil and the electrically conductive layers are provided with at least one contacting area for receiving a contacting wire. The contacting areas include a metal having a surface conductivity of at least 3 mho. The carrier foil is covered at least in the region of the contacting areas with a thermoplastic covering foil and an appropriate number of contacting wires, which may also serve as electrical leads, are fed above the covering layer at the location of the contacting areas, heated and impressed into the stack arrangement at at least points along its length through the covering foil and into one or more of the contacting areas to form therewith a mechanically stable and electrically conductive connection.

34 Claims, 4 Drawing Figures

PRODUCTION OF ELECTRICAL COMPONENTS, PARTICULARLY RC NETWORKS

BACKGROUND OF THE INVENTION

1. Field of the Invention

The present invention relates to the production of electrical components, and particularly the production of RC networks, which contain electrically conductive layers carried on thermoplastic carrier foils, and more specifically to the production of such components which are internally and/or externally contacted by connection wires connected to the layers by alloy formation in an electrically conductive and mechanically stable fashion.

2. Description of the Prior Art

In the German Pat. No. 2,037,426 wound capacitors are described which have aluminum electrode coatings, thermoplastic dielectric foils and connecting wires fused into the end faces of the capacitor and connected to the coatings by alloy formation in an electrically conductive and mechanically stable fashion. These capacitors are initially wound and are then provided with connecting wires in accordance with the fusion technique described.

SUMMARY OF THE INVENTION

It is an object of the present invention to provide a method of internally connecting the elements of electrical components, in particular RC networks, and/or providing the components with external connecting wires, which method can be employed in the mass production of such components at a very low cost of production.

The foregoing object is achieved according to the invention through the provision of a method for producing an electrical component, particularly an RC network, having a thermoplastic carrier foil with one or more electrically conductive layers carried thereon. The method comprises the steps of applying the electrically conductive layer or layers to the carrier foil, providing contacting areas on at least one of the electrically conductive layers, the contacting areas being of a metal having a surface conductivity of at least 3 mho, covering the carrier foil at least in the region of the contacting areas with a thermoplastic covering foil, feeding a wire or wires above the covering foil at the location of the contacting areas, and electrically heating the or each wire and impressing the same at least at points along the length thereof through the covering foil and onto one or more of the contacting areas to form therewith a mechanically stable and electrically conductive connection. Each wire is preferably heated by a pair of electrodes spaced apart along the length of such wire and connected to a source of current.

Advantageously, the method of the present invention can be conveniently applied to the manufacture of a plurality of the electrical components, in which case a plurality of electrically conductive layers are applied as parallel strips, or in another suitable pattern, to the or each carrier foil, and the electrical components are separated either individually or in groups either before or after the contacting step in the longitudinal direction of the foil, and after the contacting step in a direction at right angles or transversely thereto.

When the wires are fused into the covering foil, the latter fuses with the underlying carrier foil or foils. This provides a mechanically stable connection and at the same time the wire is protected from oxidation, which advantageously enhances and simplifies the alloy formation with the contact areas. A particular advantage of the method of the present invention is the ease with which the method can be automated, which, for example, enables the connecting wires to be applied to a series of components arranged adjacent one another at the edge of a carrier foil, and also the line of components arranged next to one another or one above the other, and therefore the connection of these components to form networks.

A particularly compact mode of construction consisting of a plurality of components is obtained if two or more carrier foils are each provided with electrically conductive layers and contacting areas and are arranged one above the other in such a manner that at least a part of the contacting areas lie one above the other and that in the region of the contacting layers arranged one above the other the wires are fused through the covering foil, the contacting areas and the intermediate carrier foils into the last carrier foil which can be reached by the wires. The contacting areas are therefore pierced and the connecting wires are electrically conductively connected to all of the pierced contacting areas. This method enables the most complicated and various types of interconnections of capacitors and resistors to be effective in a particularly simple and efficient manner. In the case of capacitors, it is advantageous to employ dielectric layers which are thin in relation to the dividing layers between adjacent components in order to avoid strong mutual influences between the components by way of undesired capacitances. Layers for resistors having values up to approximately 400 ohm are expediently produced from chromiumnickle alloy or from aluminum. In the case of higher resistances, e.g., 1 to 1000kΩ, the resistance layer is advantageously produced by carbon deposition.

The layers produced in this manner are reinforced at the contacting areas with a metal layer. The surface conductivity of the contacting areas is advantageously approximately 15 mho.

The term "surface conductivity" employed herein is to be understood to be the conductivity of a square area of a thin layer which has been connected to a voltage source in order to measure the conductivity along two edges arranged opposite one another, along their entire length.

If a wire is fused, in accordance with the invention, through a regenerably thin coating, a reliable, electrically conductive connection is not established between the coating and the wire. The reason for this was found to be that the cross section in the contacting zone becomes so small as a result of the flowing movements of the synthetic resin material during fusion of the carrier and covering foils that any bridges remaining between the fused-in connecting wire and the regenerably thin coating burn away during forming. It is possible to simplify the production of complicated networks by taking advantage of this feature and additionally fusing the connecting wires through regenerably thin, electrically conductive surfaces having a maximum surface conductivity of 3 mho, which surface is not to be contacted in the final product, and by following up the fusion by temporarily applying between the relevant connecting wire and the layer which is not to be connected a voltage which is sufficient to burn away any bridges which may have formed between such a layer and the connecting wire. At the same time, a flow of current which leads to the local fusion of the material of the contacting areas with that of the connecting wires may be produced at the junction points between the wires and the contacting areas. Consequently, the junction resistant at these points becomes smaller and the contact therefore becomes more reliable.

Advantageously, it is possible to simultaneously connect contacting areas arranged one above another at various points by fusing the wires into the foils at two or more limited locations by means of rams or by means of electrodes used to supply the heating current, and to impress such wires into the contact in areas. It is not necessary for these contacting areas at various points to belong to the same component. This leads to a particularly economical method for the mass production of this type of contact. A particularly reliable connection to each contacting area is achieved in that the wires are deformed in their longitudinal direction (either with or without a change in their cross section) and during the fusion process the parts of such wires which have penetrated furthest into the foils are impressed at a minimum of two points through each of the contact areas into the carrier foil and the parts of the wires which lie between these two points and which are furthest removed therefrom are only fused in as far as the first contact area to be contacted. On the contacting areas zones are therefore formed in which the wire forms an alloy with the relevant contacting area. These zones are integrally connected at a part of their boundary to the other parts of the contacting areas, whereas in the part which is more deeply impressed these zones are cut off at the sides although they are still laterally connected by way of metal bridges to the contacting areas. Those parts of the boundary of the zones of alloy formation which are integrally connected to the remaining part of the contacting areas are advantageously arranged to be as large in area and as numerous as possible, in order to achieve the best possible low resistance contact. This may be achieved by providing the wires to be fused with a wave-shaped, in particular a sinusoidal, profile. The desirable profile, of course, be formed prior to the fusion process, or can be formed during the fusion process by applying a pressure to the connecting wire at appropriate intervals.

The connecting wires should be relatively thick; therefore, it is advisable to use relatively thick wires consisting of tinned tin or aluminum bronze, which in the region of the contacting areas having a wave-shaped profile and base elements projecting from this profile so that during the fusion step the elements are fused through all of the layers and into little holding plates with which they form a mechanically stable connection after cooling. This technique at the same time ensures a particularly stable fixing of the connecting wires in the layers and an accurate positioning of the profile of the wire in relation to the last layer to be fused through. Therefore, the profile can be relatively flat whereby relatively large areas of the zones of the alloy formation are integrally connected to the remaining parts of the contacting areas. At the same time, relatively thick tinned wires can be used which, in order to achieve a high mechanical stability, may consist of tin or aluminum bronze, or in order to provide a particularly good heat conductivity, may consist of copper. During the contacting step, the molten tin flows upwardly along the wire so that the oxide-free wire surface so exposed can readily form an alloy with the metal coating, which preferably consists of aluminum. If straight wires of high mechanical resistance are to be fused into the foils merely at individual points, it is advisable to use wires made of tin or aluminum bronze, which by heating to above the softening point can be deformed in the desired fashion during the fusion step, but nevertheless produce a connection of high mechanical stability on cooling.

If the depth of penetration of the connecting wires is to be limited, it is most advantageous to effect such limitation by means of a layer arranged in an appropriate position in the layer stack and having a high thermal short-term resistance. This will, for example, enable two connecting wires to be fused in from two sides of a component at the same time, both penetrating only to a certain depth. Polyimides, polyimidamites and polyhydantoins are suitable materials for use as layers having a high termo short-term resistance.

The term "thermal short-term resistance" as employed herein means the resistance, which in an otherwise identical arrangement, opposes the penetration of a wire during fusion under identical conditions. This resistance can be stated, for example, in seconds per millimeter of penetration.

Two covering foils will be required to protect the conductive layers when a carrier foil coated on both sides with such conductive layers is employed. In such a case, the carrier foil is arranged between two covering foils and wires will preferably be fused in from both sides. At least one of the covering foils should consist of a material having good adhesive strength. This is assisted by the use of a covering foil made of polyethylene terephthalate and a carrier foil and possibly a second covering foil consisting of one of the materials from the following group: polyimides, polysulphones having a melting point of above 200°C, and polyethylene terephthalate.

Simple mass production is possible with the method of the present invention if the same patterns on the electically conductive layers are continuously applied to a carrier foil, wires serving merely for interconnecting overlying contacting areas being fused by means of two electrodes in each case into two adjacent components, which are between the electrodes only penetrating as far as the first layer to be contacted, and external connecting wires being fed across the carrier foil transverse to the longitudinal direction of the latter and fused into the appropriate contacting area or areas of the component at the edge of the foil. The ends of such wires are then subsequently cut off so that they project beyond the carrier foil by the required length. The wire which serves merely for interconnection does not need to be cut off, and the contacting can be effected at points on the carrier foil remote from the components which have been provided with connecting wires to serve as electrical leads.

In the case of a series of components arranged in this manner on a carrier foil, a simple slit or scratched channel will be sufficient to penetrate two parts of a regenerably thin coating having a conductivity of no more than 3 mho without damaging the underlying dielectric if, during forming, this coating is exposed to a flow of current in a direction perpendicular to the scratched channel sufficient to burn away any bridges remaining along the channel. Instead of scratching, it is also possible to employ etching, arc burning or vaporization by laser beams to separate the coating surfaces.

BRIEF DESCRIPTION OF THE DRAWING

Other objects, features and advantages of the invention, its organization and techniques for carrying the invention into practice will be best understood from the following detail description of preferred embodiments thereof taken in conjunction with the accompanying drawing on which.

DESCRIPTION OF THE PREFERRED EMBODIMENTS

Figure 1:
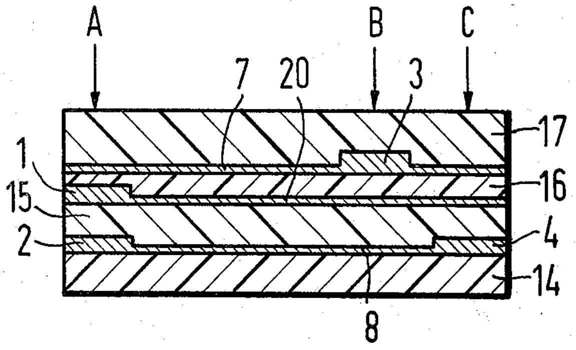
FIG. 1 is a sectional elevation of a component comprising a series connected capacitor and resistor which have been produced in accordance with the present invention, before contacting.

Referring to FIG. 1, an electrical component is illustrated as comprising a first carrier foil 14 which is coated with a resistive layer 8. The resistive layer 8 is provided with two contacting areas 2 and 4. A second carrier foil 15 is stacked on the resistive layer 8 and is coated on its upper surface with a capacitor foil 20 having a contacting area 1. The capacitor coating 20 carries a dielectric layer 16, which, in turn, carries a second capacitor coating 7 having a contacting area 3. Each of the contacting areas 1 to 4 is of a metal having a surface conductivity of at least 3 mho. A covering foil 17 is applied over the upper capacitor coating or layer 7 and preferably consists of polyethylene terephthalate. If a wire is now fused into the stack of foils in the direction and at the position of an arrow A, it penetrates all the layers in turn until, having penetrated into the first carrier foil 14, its thermo energy has been used up. In this case, the regenerable capacitor coating 7 is not contacted, and any weak contacting points which may exist are burned away in the course of forming. However, the contacting areas 1 and 2 of the capacitor coating 20 and of the resistive layer 8, respectively, are connected to one another by fusion with such a wire.

By fusing connecting wires in the direction of and at the positions of an arrow B and at arrow C, the contacting areas 3 and 4 respectively are contacted. The regenerably thin layers, i.e. the capacitor coating 20 and the resistive layer 8 at the position B, and the capacitor coatings 7 and 20 at the position A, which are also penetrated by the connecting wire are again not contacted, or only to such an extent that the contacting can be burned away by a flow of current between the connecting wire and the layer in question. The fusion of a connecting wire at the positions and in the directions of the arrows B and C forms a series connection between the capacitor which is formed between the coatings 7 and 20 and the resistor formed by the resistive layer 8. In order to avoid the capacitance between the capacitor coating 20 and the resistive layer 8 having a disturbing effect, layer 15 is arranged to be considerably thicker than the dielectric layer 16.

Figure 2:
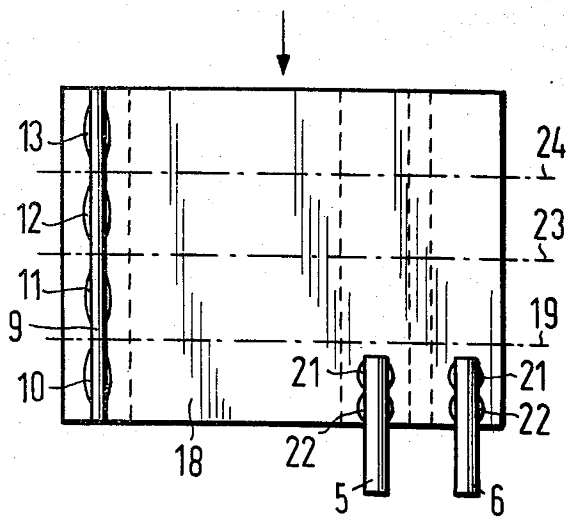
FIG. 2 is a plan view of a plurality of components as illustrated in FIG. 1 after the application of connecting wires.

Referring to FIG. 2, a plan view of the layer stack illustrated in FIG. 1 is shown, although the extent and the position of the contacting areas has not been accurately illustrated, only indicated by broken lines. As can be seen in the drawing, a wire 9 has been fused in contacting zones 10, 11, 12 and 13 through to the corresponding contacting areas 1 and 2 in the stack of foils. The electrodes were initially pressed onto the contacting zones 10 and 11, whereafter the foil stack was displaced in the direction of the arrow (downwardly) by twice the distance between two contacting zones, so that in the next fusion process the electrodes could be pressed onto the contacting zones 12 and 13. The distance between the contacting zones and the stiffness of the wires were so selected that in the region between the contacting zones the wire only penetrated as far as the first conductive layer, i.e., to the capacitor coating 7. After, or simultaneously with, the fusion of the wire into the contacting zones 12 and 13, connecting wires 5 and 6 were fused into the corresponding contacting areas 3 and 4, respectively. Prior to the contacting and fusing process, the profile was impressed into the connectings wires 5 and 6 such that each connecting wire provides contacting zones 21 and 22 arranged close to one another. A finished component 18, which contains a series connection of one capacitor and one resistor is then separated from the remainder of the stack along a dividing line 19. Additional dividing lines 23 and 24 correspond in turn with the position of the dividing line 19 as the foil stack is moved in the direction of the arrow, and it is along these lines that the latter will be separated in the same manner as the component 18 on completion of the contacting of further components.

Figure 3:
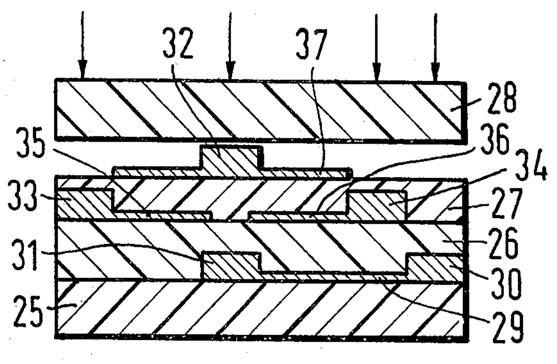
FIG. 3 is a sectional elevation of a further component produced by a method according to the present invention, before contacting.

In the arrangement illustrated in FIG. 3, a carrier foil 25 carries a resistive layer 29 having contacting areas 30 and 31. A relatively thick insulating layer 26 is carried over the layer 25 and the resistive layer 29 and in turn carries a pair of capacitor layers 35 and 36 having respective contacting areas 33 and 34. A dielectric layer 27 covers the capacitor layers 35 and 36 and the insulating layer 26 and supports a capacitor layer 37 which is associated with both of the capacitive layers 35 and 36 and which has a contacting area 32. The entire arrangement is then covered with a covering foil 28.

Figure 4:
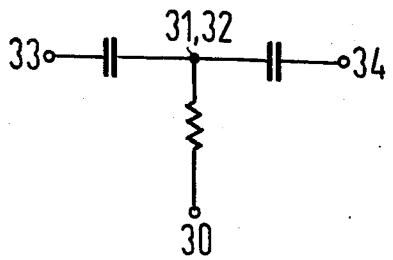
FIG. 4 is a schematic circuit diagram of the component illustrated in FIG. 3.

The capacitor coatings 35, 36 and 37 and the resistive layer 29 extend only over a requisite area for the particular component to be produced, and metal-free zones have been left exposed for the wires to be fused in on those layers which are not to be contacted, which results in a particularly low loss factor. The fusing in of wires at the four points indicated by arrows results in the connection of the layers to form the circuit illustrated in FIG. 4. As can be seen from FIGS. 3 and 4, the wires fused into the contacting areas 33, 34 and 30 serve as external connecting wires, whereas the wire which has been fused through the two contacting areas 31 and 32 serves merely to interconnect these two contacting areas, but not, however, as an external connecting wire. Accordingly, this wire also does not need to project beyond the component at any point.

The wire which is to contact the contacting areas 34 can, if desired, fuse through the resistive layer 29. In this case, there is a certain increase in the electrical resistance between the contacting areas 30 and 31, but there is no contacting of the resistive layer 29 if any conductive bridges formed are burned away. If the insulating layer 26 is made of an appropriate thickness, or if this layer has a relatively high thermal short-term resistance, the connecting wire can be prevented from penetrating through the contacting area 34 into the resistive layer 29 when it is necessary to keep the resistance valve of the layer 29 accurate.

Although we have described our invention by reference to particular illustrative embodiments thereof, many changes and modifications of the invention may become apparent to those skilled in the art without departing from the spirit and scope of the invention. We therefore intend to include within the patent warrented hereon all such changes and modifications as may reasonably and properly be included within the scope of our contribution to the art.

We claim:

1. A method of producing an electrical component comprising the steps of: applying first and second conductive layers respectively to opposite sides of a thermoplastic carrier foil; forming contacting areas at selected locations on said conductive layers; covering each of the conductive layers with a polyethylene terephthalate covering layer; positioning wires adjacent the covered contacting areas; and fusing the wires with the contacting areas by heating the wires and impressing the heated wires through the covering layers and through and into electrical contact with the contacting areas.

2. The method of claim 1, comprising the steps of providing the carrier foil from a material selected from the group consisting of a polyamide, a polysulphone having a melting point above 200 °C, and polyethylene terephthalate.

3. A method of producing an electrical component having a thermoplastic carrier foil with an electrically conductive layer applied thereto, comprising the steps of: applying at least one electrically conductive layer to a thermoplastic carrier foil; forming contacting areas on said conductive layer with a metal having a surface conductivity of at least 3 mho; covering the conductive layer at least in the regions of the contacting areas with a polyethylene terephthalate covering foil; feeding wires adjacent regions of the covering foil having the contacting areas therebelow; and contacting the wires and contacting areas by heating each wire and impressing each heated wire through the covering foil and one or more of the contacting areas to fuse therewith and form mechanically stable and electrically conductive sections.

4. The method of claim 3, comprising the steps of forming each wire with a wave-shaped profile and base elements which extend beyond the profile for fusion with the contact areas.

5. The method of claim 3, comprising the steps of providing the contacting areas with a metal having a surface conductivity of about 15 mho and the covering foil as polyethylene terephthalate.

6. The method of claim 3, comprising the steps of providing the carrier foil from a material selected from the group consisting of a polyamide, a polysulphone having a melting point above 200°C, and polyethylene terephthalate.

7. The method of claim 3, wherein the step of heating is further defined as electrically heating each wire by flowing current therethrough.

8. The method of claim 3, wherein the step of applying at least one conductive layer is further defined as applying a pattern of conductors to the carrier foil; and further comprising the step of separating the layered structure into smaller layered structures at a time subsequent to the step of covering with a covering foil.

9. The method of claim 8, wherein the step of applying is further defined as applying a continuous pattern in the longitudinal direction of the carrier foil, and the step of separating is defined as cutting through the stacked structure in the longitudinal direction before the step of contacting.

10. The method of claim 8, wherein the step of applying is further defined as applying a continuous pattern in the longitudinal direction of the carrier foil, and the step of separating is defined as cutting through the stacked structure in the longitudinal direction after the step of contacting.

11. The method of claim 8, wherein the step of applying is further defined as applying a continuous pattern in the longitudinal direction of the carrier foil, and the step of separating is defined as cutting through the stacked structure in a direction transverse to the longitudinal direction after the step of contacting.

12. A method of producing an electrical component having a thermoplastic carrier foil with an electrically conductive layer applied thereto, comprising the steps of: applying at least one electrically conductive layer to a thermoplastic carrier foil; forming contacting areas on said conductive layer with a metal having a surface conductivity of at least 3 mho; covering the conductive layer at least in the regions of the contacting areas with a polyethylene terephthalate covering foil; feeding wires adjacent regions of the covering foil having the contacting areas therebelow; and contacting the wires and contacting areas by heating each wire and impressing each heated wire through the covering and through one or more of the contacting areas diffused therewith and form mechanically stable and electrically conductive sections, the step of applying at least one conductive layer including the step of applying to the carrier foil in addition to the one conductive layer and forming contacting areas thereon the steps of applying a second conductive layer spaced from said one conductive layer and having a thin portion with a surface conductivity of no greater than 3 mho adjacent the thin portion not to be contacted, wherein the thin portion is burned away during passage of a heated wire therethrough during the step of contacting.

13. The method of claim 12, comprising the step of applying a voltage to each wire passed through one of the thin portions to burn away bridges formed between the wire and the layer which is not to be contacted.

14. A method of producing an electrical component comprising the steps of: arranging alternate conductive and nonconductive layers in a stacked relation on a thermoplastic carrier foil; forming contacting areas at selected locations at least at one location on each of the conductive layers with a metal having a surface conductivity of at least 3 mho and positioning such areas, during the step of arranging, adjacent portions of others of said conductive layers which are not to be connected therewith and having a surface conductivity of less than 3 mho; covering the stacked arranged with a polyethylene terephthalate cover layer at least in the regions of exposed ones of the contacting areas; guiding wires next to the stacked arrangement adjacent regions having contacting areas therebehind; and contacting the contacting areas with correspondingly positioned wires by heating the wires and impressing the wires into the stacked arrangement to pass through portions having less than 3 mho surface conductivity and fuse with the contacting areas to form mechanically stable and electrically conductive connections therewith.

15. The method of claim 14, comprising the step of applying a voltage to a wire which has penetrated a conductive layer to which is not to be connected to burn away any bridges formed therebetween.

16. The method of claim 14, comprising the steps of dimensioning the elements of the stacked arrangement so as to form a carrier strip having a longitudinal direction and a transverse direction, said step of contacting is further defined by the steps of connecting current carrying ram-type electrodes to wires positioned longitudinally of said strip to heat and impress the wires at the ram-type electrode positions, cutting the strip and longitudinal wires to separate electrical components, and contacting terminal leads by heating the leads and impressing the heated leads at spaced location transversely of a component.

17. The method of claim 14, comprising the step of deforming the wires in the direction of impression.

18. The method of claim 17, wherein the step of deforming is further defined by the step of bending each wire to provide a profile which provides at least two points of contact with the contacting areas of innermost conductive layer to be contacted by the respective wire.

19. The method of claim 17, wherein the step of deforming is contemporaneously performed with the step of impressing the wires.

20. The method of claim 17, comprising the step of limiting wire penetration by providing at least one layer of a material having a high thermal short-term resistance and arranging such layer in the stacked arrangement at the point of deepest penetration by a wire.

21. A method of producing an electrical component comprising the steps of: arranging alternate conductive and nonconductive layers in a stacked relation on a thermoplastic carrier foil; forming contacting areas at selected locations at least at one location on each of the conductive layers with a metal having a surface conductivity of at least 3 mho and positioning such areas, during the step of arranging, adjacent portions of others of said conductive layers which are not to be connected therewith and having a surface conductivity of less than 3 mho forming openings in the 3 mho surface conductivity material adjacent the contacting areas; covering the stacked arranged with a polyethylene terephthalate cover layer at least in the regions of exposed ones of the contacting areas; guiding wires next to the stacked arrangement adjacent regions having contacting areas therebehind; and contacting the contacting areas with correspondingly positioned wires by heating the wires and impressing the wires into the stacked arrangement to pass through the openings in the material having less than 3 mho surface conductivity and fuse with the contacting areas to form mechanically stable and electrically conductive connections therewith.

22. The method of claim 21, comprising the steps of providing the carrier foil and the covering foil from a material selected from the group consisting of a polyamide, a polysulphone having a melting point above 200°C, and polyethylene terephthalate.

23. A method of producing an electrical component comprising the steps of: coating at least one thermoplastic carrier foil with at least one electrically conductive layer of a material having a first surface conductivity; forming contacting areas on each conductive layer so formed with a metal having a greater second surface conductivity; applying a polyethylene terephthalate covering foil over at least the regions of each contacting area; feeding wires substantially parallel to the covering foil adjacent respective contacting areas; heating the wires; and pressing each of the heated wires into the layers and melting through any carrier foil and any first surface conductivity material in the path of impression to fuse with the respective contacting areas and form mechanically stable and electrically conductive connections.

24. The method of claim 23, comprising the steps of: stacking a plurality of the coated thermoplastic layers with certain of the contacting areas superimposed; and wherein the step of pressing each wire is further defined as pressing each heated wire into the stack as far as the last respective superposed contacting area to fuse each wire with all of its respective superposed contacting areas.

25. The method of claim 23, wherein the step of pressing is further defined as pressing each wire into the layers at spaced points along the length of the wire.

26. The method of claim 23, wherein the step of heating is further defined as applying heating electrodes at spaced points along each wire, and the step of pressing is further defined as moving the electrodes toward the layers to force each wire into the layers.

27. The method of claim 23, comprising the step of deforming each wire in its cross-section to provide connecting lugs.

28. The method of claim 23, comprising the step of deforming the wires in their longitudinal directions during impression into the layers so that each wire contacts the innermost contacting area in at least two places and limiting impression of the portions of wire between each two such places so that they are not melted in as far as the first area to be contacted.

29. The method of claim 28, comprising the step of deforming the cross-section of each wire to provide connecting lugs.

30. The method of claim 23, comprising the steps of: forming a wave-shaped profile along each of the wires; and forming connecting lugs which extend beyond the wave-shaped profile at points to be fused to little holding plates behind the innermost layer.

31. The method of claim 23, wherein the step of applying a conductive layer is further defined as applying a repetitive respective conductive pattern on each of a number of respective thermoplastic bands, the step of forming contacting areas is defined as forming the desired contacting areas on each repetition and stacking the coated bands with certain of the contacting areas superposed and moving the band longitudinally the steps of heating and pressing are further defined as applying heating electrodes at spaced points along each wire to heat the same and pushing the wire into the stack to melt therethrough at the points inwardly as far as the last respective contacting area while limiting the melting in of wire between two points to the first coating which is to be through-contacted; feeding additional wires over the marginal area of the edge of the parallel to contacting areas which are to be connected as component terminals; heating and impressing the additional wires to fuse the same to the respective contacting areas; and cutting the band transverse to the longitudinal dimension thereof between the aforementioned points.

32. The method of claim 23, wherein the step of coating is further defined as coating a regenerably thin conductive layer from material having a surface conductivity of not more than 3 mho; and comprising the further step of scratching a groove in the 3 mho coating at points to be pierced by a wire and applying a potential to the coating and wire to burn away any conductive bridges therebetween after melting-in of the wire.

33. The method of claim 12, comprising the steps of providing the carrier foil from a material selected from the group consisting of a polyamide, a polysulphone having a melting point above 200 °C, and polyethylene terephthalate.

34. The method of claim 23, comprising the steps of providing the carrier foil from a material selected from the group consisting of a polyamide, a polysulphone having a melting point above 200 °C, and polyethylene terephthalate.

* * * * *